United States Patent
Choi

(10) Patent No.: US 6,346,845 B1
(45) Date of Patent: Feb. 12, 2002

(54) FUSE CIRCUITS AND METHODS THAT CAN SENSE THE STATE OF A FUSE THAT IS PROGRAMMED BUT NOT OPEN

(75) Inventor: Jin-sub Choi, Kyungki-do (KR)

(73) Assignee: Samsung Electronic Co., Ltd. (KR)

( * ) Notice: Subject to any disclaimer, the term of this patent is extended or adjusted under 35 U.S.C. 154(b) by 0 days.

(21) Appl. No.: 09/159,144

(22) Filed: Sep. 23, 1998

(30) Foreign Application Priority Data

Nov. 12, 1997 (KR) .............................. 97-59414

(51) Int. Cl.[7] .............................................. H01H 85/00
(52) U.S. Cl. ..................................... 327/525; 365/225.7
(58) Field of Search ................................ 327/525, 526; 326/37, 38; 365/225.7; 324/769

(56) References Cited

U.S. PATENT DOCUMENTS

| | | | | |
|---|---|---|---|---|
| 4,730,129 A | * | 3/1988 | Kunitoki et al. ............. | 327/525 |
| 5,384,746 A | * | 1/1995 | Giolma .................... | 365/225.7 |
| 5,453,696 A | * | 9/1995 | Becker et al. .............. | 327/525 |
| 5,731,733 A | | 3/1998 | Denham .................... | 327/525 |
| 5,767,732 A | * | 6/1998 | Lee et al. .................. | 327/525 |
| 5,801,574 A | * | 9/1998 | Martin et al. ............... | 327/525 |
| 5,838,624 A | * | 11/1998 | Pilling et al. ............. | 365/225.7 |
| 5,929,691 A | * | 7/1999 | Kim et al. .................. | 327/525 |
| 5,852,580 A | * | 8/1999 | Ha .............................. | 365/200 |
| 5,946,497 A | * | 8/1999 | Lee et al. ................. | 395/88.37 |
| 5,959,445 A | * | 9/1999 | Denham ..................... | 323/315 |
| 5,982,656 A | * | 11/1999 | Cutter et al. ................... | 365/96 |

* cited by examiner

*Primary Examiner*—Kenneth B. Wells
(74) *Attorney, Agent, or Firm*—Myers Bigel Sibley & Sajovec

(57) ABSTRACT

Fuse circuits and methods program a fuse by applying a program current to the fuse that is sufficient to increase the impedance of the fuse without opening the fuse, apply a sensing current to the fuse in response to a reset signal and otherwise sense whether the fuse is programmed without applying sensing current to the fuse. By maintaining essentially zero current through the fuse after programming, reduced current consumption and accurate sensing of programming state can be maintained, even though programming the fuse does not produce an open circuit, but rather only increases the impedance of the fuse. More specifically, a sensing current is applied to the fuse, to thereby determine the programmed or unprogrammed state of the fuse, wherein the fuse has a low impedance in the unprogrammed state, and the fuse has a high impedance but is not open in the programmed state. The programmed or unprogrammed state of the fuse is latched. Application of the sensing current is then terminated. The sensing current may be applied in response to activation of a reset signal, and application of the sensing current may be terminated in response to deactivation of the reset signal.

20 Claims, 2 Drawing Sheets

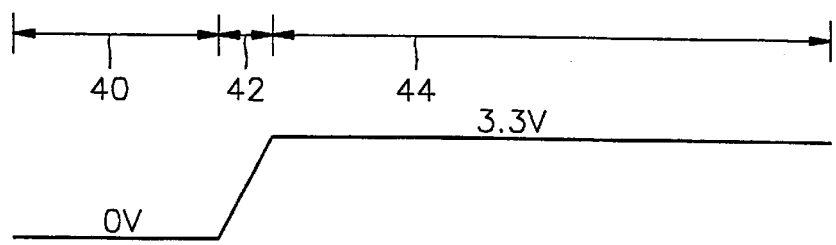
FIG. 2A
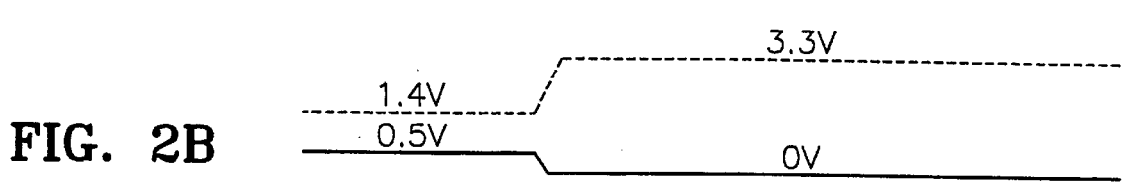
FIG. 2B
FIG. 2C
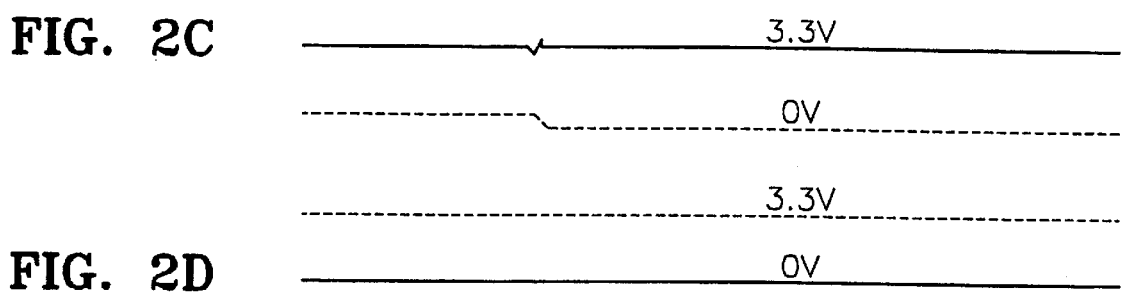
FIG. 2D
FIG. 2E
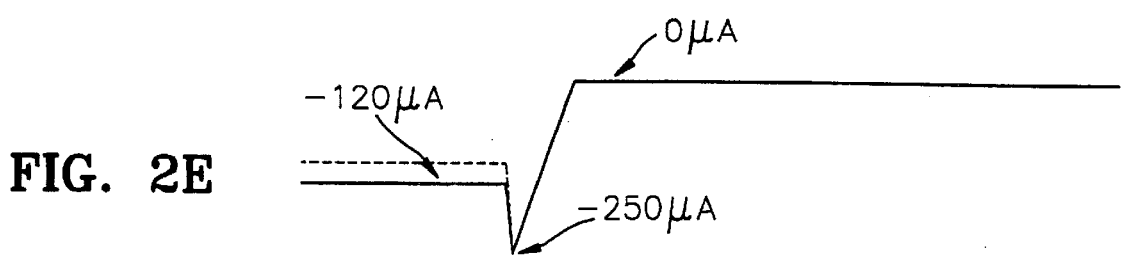

FUSE CIRCUITS AND METHODS THAT CAN SENSE THE STATE OF A FUSE THAT IS PROGRAMMED BUT NOT OPEN

FIELD OF THE INVENTION

This invention relates to integrated circuit devices and methods, and more particularly to integrated circuit fuse circuits and related methods.

BACKGROUND OF THE INVENTION

Fuses are widely used in integrated circuits in order to program values or set operating parameters for the integrated circuit. In a conventional fuse, a pad is formed at both ends of the fuse, and the fuse can be directly programmed via the pads. The fuse may be programmed during testing or at other times during the manufacture of the integrated circuit. Such a conventional fuse can generally be programmed easily and accurately. Unfortunately, the need to provide a pair of pads for each fuse may limit the number of fuses that can be used in an integrated circuit, due to constraints on the number of pads that can be provided.

In order to solve this problem, it is known to provide a plurality of fuses in an integrated circuit and to program these fuses using a fusing current and a switch. More specifically, an internal switch is activated in response to an external control signal. A predetermined programming current, also referred to as a fusing current, is supplied to the appropriate fuse in response to activation of the switch.

When such programming techniques are used, however, the amount of current that may be supplied to the fuse may be limited. Accordingly, when programming the fuse, the fuse may not be opened. Rather, the impedance of the fuse may increase by an order of magnitude, for example from several tens of kΩ, to several hundreds of kΩ. This contrasts sharply with a conventional fuse which essentially is a short circuit when unprogrammed, and an open circuit when programmed.

Unfortunately, it may become more difficult to accurately detect whether such a fuse has been programmed, with a high degree of accuracy. See, for example, U.S. Pat. No. 5,731,733 to Denham entitled "Static, Low Current Sensing Circuit for Sensing the State of a Fuse Device".

The accuracy of sensing may be increased by reducing the resistance value of the fuse. However, the reduced resistance may increase the amount of current consumption in the fuse, and thereby undesirably increase the power consumption of the integrated circuit. Accordingly, there continues to be a need for improved fuse circuits and methods that can accurately sense whether a fuse is programmed.

SUMMARY OF THE INVENTION

It is therefore an object of the present invention to provide improved fuse programming and sensing circuits and related methods.

It is another object of the present invention to provide improved fuse sensing circuits that can sense whether or not a fuse is programmed, even though programming the fuse only increases the impedance thereof, but does not open circuit the fuse.

These and other objects are provided, according to the present invention, by fuse circuits and methods that program a fuse by applying a program current to the fuse that is sufficient to increase the impedance of the fuse without opening the fuse, that apply a sensing current to the fuse in response to a reset signal and that otherwise sense whether the fuse is programmed without applying sensing current to the fuse. By maintaining essentially zero current through the fuse after programming, reduced current consumption and accurate sensing of programming state can be maintained, even though programming the fuse does not produce an open circuit, but rather only increases the impedance of the fuse.

More specifically, according to the invention, a sensing current is applied to the fuse, to thereby determine the programmed or unprogrammed state of the fuse, wherein the fuse has a low impedance in the unprogrammed state, and the fuse has a high impedance but is not open in the programmed state. The programmed or unprogrammed state of the fuse is latched. Application of the sensing current is then terminated. The sensing current may be applied in response to activation of a reset signal, and application of the sensing current may be terminated in response to deactivation of the reset signal.

Even more specifically, fusing circuits according to the invention include a fuse and a first circuit that programs the fuse by applying a programming current to the fuse that is sufficient to increase the impedance of the fuse without opening the fuse. A current supply, a first switch and a second switch are serially connected to the fuse. The first switch and the second switch define a node therebetween. A second circuit generates a first control signal for the first switch and a second control signal for the second switch in response to a reset signal. Finally, a third circuit produces an output signal that indicates whether the fuse is programmed in response to a voltage in the node.

The first and second switches preferably comprise respective first and second field effect transistors of opposite conductivity types. The third circuit preferably comprises an inverter that produces the output signal from the voltage of the node. The second circuit is preferably responsive to the output signal and the reset signal. The second circuit preferably comprises a first logic circuit that is responsive to the reset signal and to the output signal, to generate the first control signal and a second logic circuit that is responsive to the reset signal and to the output signal to generate the second control signal. Accordingly, current may be applied to the fuse only during application of the reset signal. Otherwise, programming of the fuse is sensed without applying sensing current to the fuse. Low power and reliable sensing can therefore be obtained.

BRIEF DESCRIPTION OF THE DRAWINGS

FIGS. 2A through 2E are waveforms for elements of FIG. 1.

DETAILED DESCRIPTION OF PREFERRED EMBODIMENTS

Figure 1:
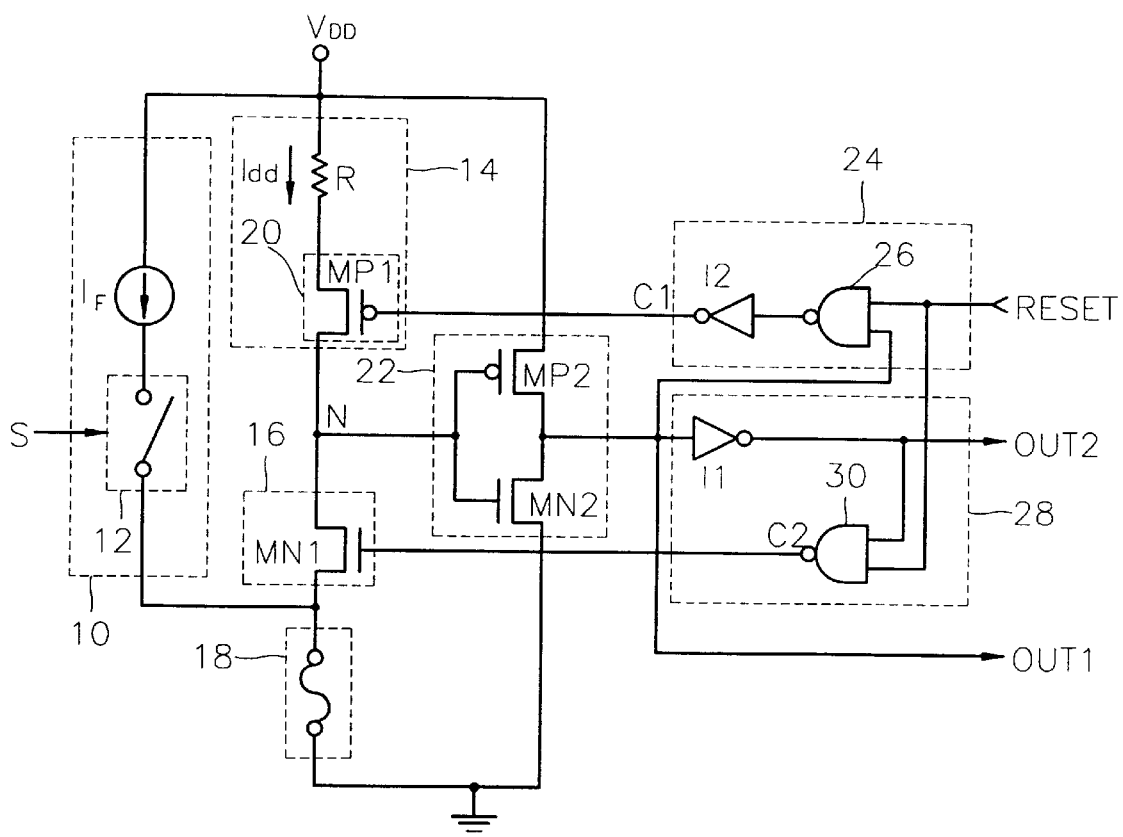
FIG. 1 is a circuit diagram of a preferred embodiment of fuse circuits and methods according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Each embodiment described and illustrated herein includes its complementary conductivity type embodiment as well.

Referring to FIG. 1, a fuse circuit according to a preferred embodiment of the present invention includes a fuse 18, a fuse programmer 10, a current supply unit 14 a first switch 20, a second switch 16, an inverter unit 22 and first and second control signal generators 24 and 28.

The fuse programmer 10 shown in FIG. 1 includes a current source $I_F$ and a switch 12, and provides a predetermined programming current or fusing current $I_F$ to the fuse 18 in response to a fusing control signal S. That is, the current source $I_F$ in the fuse programmer 10 is connected between the switch 12 and a power source $V_{DD}$ to supply the current $I_F$ to the switch 12. The switch 12 is turned on in response to the fusing control signal S which may be input from an external source, to provide the fusing current $I_F$ to the fuse 18.

The current supply unit 14 includes a transistor MP1 that operates as a first switch 20 and a resistor R connected between the power supply $V_{DD}$ and the source of the transistor MP1. The resistor R operates as a current supply and the first switch MP1 provides a predetermined current to a node N in response to a first control signal C1. That is, the transistor MP1 is turned on in response to the first control signal C1 to provide a predetermined current via the resistor R to the node N. The second switch 16, which includes a transistor MN1, supplies the predetermined current from the current supply unit 14 to the fuse 18 in response to a second control signal C2.

The inverter unit 22, for example a CMOS inverter comprising transistors MP2 and MN2, inverts the level of a signal at node N between the current supply unit 14 and the switch 16, and provides the inverted signal at an output terminal OUT1.

The first control signal generator 24 includes an inverter I2 and a NAND gate 26, that logically combine a reset signal RESET that is input from an external source and an output signal of the inverter unit 22, and provide the result as the first control signal C1. That is, the NAND gate 26 performs an inverted-AND operation on the reset signal RESET and the output signal of the inverter unit 22 and provides the result of the inverted-AND operation to the inverter I2. The inverter I2 inverts the output of the NAND gate 26 and provides the result as the first control signal C1 to the gate of the transistor MP1.

The second control signal generator 28 includes an inverter I1 and a NAND gate 30, that logically combines the inverted signal output via an output terminal OUT2 and the reset signal RESET, and provides the result as a second control signal C2. That is, the inverter I1 inverts the output signal of the inverter unit 22 and outputs the result to the NAND gate 30. The NAND gate 30 performs an inverted-AND operation on the reset signal RESET and the output of the inverter I1, and provides the result as the second control signal C2 to the gate of the transistor MN1.

In order to facilitate the understanding of the present invention, it is assumed that the impedance of the unprogrammed fuse 18, which may actually vary between several Ω and several tens of Ω, is 1 kΩ, and that the impedance of the programmed fuse 18, which may actually vary between several tens of kΩ and several hundreds of kΩ, is 10 kΩ. Also, it is assumed that the aspect ratios (W/L) of the transistors MP1, MN1, MP2 and MN2 are 6/1, 3/0.8, 2/6 and 3/0.8, respectively, that the supplied power $V_{DD}$ is 3.3V, and that the value of the resistor R is 10 kΩ. Under these assumptions, operation of the fusing device shown in FIG. 1 will now be described.

FIGS. 2A through 2E show waveforms of elements of the circuit of FIG. 1 under the above-described assumptions.

FIG. 2A represents the waveform of the reset signal RESET and FIG. 2B represents the waveform of the voltage applied to the node N. FIG. 2C represents the waveform of the output signal OUT1 and FIG. 2D represents the waveform of the output signal OUT2 of the inverter unit 22. Finally, FIG. 2E represents the waveform of the current $I_{dd}$ flowing via the resistor R. In FIGS. 2B–2E, a solid line represents the waveform when the fuse is not programmed, and a dotted line represents the waveform when the fuse is programmed.

First, operation when the fuse 18 is not programmed will be described. When the reset signal (RESET) shown in FIG. 2A is at a low logic level, i.e., in a reset-on time period 40, the transistors MP1 and MN1 shown in FIG. 1 are turned on, and the voltage on the node N is determined by a value obtained by adding the turn-on resistance of the transistor MP1 to the resistance R and by a value obtained by adding the impedance of the unprogrammed fuse 18 to the turn-on resistance of the transistor MN1. Thus, the voltage of the node N is about 0.5V as shown in FIG. 2B. Therefore, a signal having a high logic level of about 3.3V is output via the output terminal OUT1 as shown in FIG. 2C, and a signal having low logic level of 0V is output via the output terminal OUT2 as shown in FIG. 2D.

Then, the reset signal RESET shown in FIG. 2A changes from a low logic level to a high logic level, i.e., in time period 42. When the reset signal RESET is in a reset-off time period 44 at a high level, the transistor MP1 shown in FIG. 1 is turned off, and the transistor MN1 maintains the turned-on state, so that the voltage on the node N is latched at a low logic level of 0V as shown in FIG. 2B. Therefore, the output signals output via the output terminals OUT1 and OUT2 as shown in FIGS. 2C and 2D maintain the same level as when the reset signal RESET is in the reset-on time period 40.

As described above, although the switch 12 of the fuse programmer 10 is turned on to provide the fusing current $I_F$ to the fuse 18, the fuse 18 may not be completely opened. As a result, the impedance of the fuse 18 increases as described above, but the fuse is not an open circuit. Operation of the fuse circuit shown in FIG. 1 will now be described after programming.

In the reset-on time period 40, since the reset signal RESET is at a low logic level as shown in FIG. 2A, the transistors MP1 and MN1 are all turned on, so that a voltage of about 1.4V is applied to the node as shown in FIG. 2B. The aspect ratios of the transistors MP2 and MN2 are controlled to allow the transistors MP2 and MN2 to recognize that a signal having a high logic level is applied to a gate when the voltage of the node N applied to each gate is equal to or greater than about 0.9V. Therefore, the transistor MP2 is turned off, and the transistor MN2 is turned on. Thus, a signal of a low logic level is output via the output terminal OUT1 as shown in FIG. 2C, and a signal of a high logic level is output via the output terminal OUT2 as shown in FIG. 2D.

In the reset-off time period 44 after the reset-on time period 42, the reset signal RESET is at a high logic level. Accordingly, the transistor MP1 maintains a turned-on state, and the transistor MN1 is turned off. Therefore, the potential of the node N is latched to a high logic level of 3.3V as shown in FIG. 2B, and the signals, shown in FIGS. 2C and 2D, output via the output terminals OUT1 and OUT2 are latched to the same signal level as in the reset-on time period 40.

As described above, the logic levels of the output signals determined in the reset-on time period 40 are maintained in the reset-off time period 44. However, in the reset-off time period 44, one of the transistors MP1 and MN1, for example the transistor MN1 in the preferred embodiment, is turned off, so that consumption of current is prevented in the reset-off time period 44 as shown in FIG. 2E. See the portion of FIG. 2E labeled "0 µA" in the reset-off time period 44. Accordingly, whether or not the fuse is programmed, no sensing current is applied to the fuse during the reset-off time period. Also, if the value of the resistance R is reduced, a fusing effect can be obtained even at a lower fusing impedance, thus allowing further improvement in the sensing reliability.

As described above, when a fuse is not completely opened, fuse circuits according to the present invention may consume a small amount of current only during the initial reset-on state, but need not consume current during the primary reset-off state. Thus, the circuit can operate as if the fuse was an open circuit. Thus, the failure rate of integrated circuits including the fuse circuits can be lowered.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A fuse circuit comprising:
   a node;
   a fuse that is electrically coupled to the node;
   means for programming the fuse by applying a programming current to the fuse that is sufficient to increase the impedance of the fuse without opening the fuse; and
   means for applying a sensing current to the fuse through the node in response to a first transition of a reset signal such that a voltage is generated at the node that is indicative of a programming state of the fuse; and
   means for deactivating the sensing current in response to a second transition of the reset signal such that the voltage that is generated at the node remains indicative of the programming state of the fuse.

2. A fuse circuit according to claim 1 further comprising means for storing whether the fuse is programmed in response to the reset signal to thereby sense whether the fuse is programmed without applying sensing current to the fuse.

3. A fuse circuit comprising:
   a node;
   a fuse that is electrically coupled to the node;
   a first circuit that programs the fuse by applying a programming current to the fuse that is sufficient to increase the impedance of the fuse without opening the fuse; and
   a second circuit that applies a sensing current to the fuse through the node in response to a transition of a reset signal from a first state to a second state such that a voltage is generated at the node that is indicative of a programming state of the fuse, and that deactivates the sensing current in response to a transition of the reset signal from the second state to the first state such that the voltage that is generated at the node remains indicative of the programming state of the fuse.

4. A fuse circuit according to claim 3 wherein the second circuit latches whether the fuse is programmed in response to the reset signal to thereby sense whether the fuse is programmed without applying sensing current to the fuse.

5. A method for sensing whether a fuse is unprogrammed or programmed, wherein the unprogrammed fuse has a first impedance and wherein the programmed fuse has a second impedance that is higher than the first impedance but is not open, the method comprising the steps of:
   applying a sensing current to the fuse through a node in response to a first transition of a reset signal;
   generating a voltage at the node that is indicative of the programming state of the fuse; and
   deactivating the sensing current in response to a second transition of the reset signal such that the voltage that is generated at the node remains indicative of the programming state of the fuse.

6. A method according to claim 5 wherein the generating step further comprises the step of storing whether the fuse is programmed in response to the reset signal.

7. A circuit that senses a programmed or unprogrammed state of a fuse, wherein the fuse has a first impedance in the unprogrammed state and the fuse has a second impedance that is higher than the first impedance but is not open in the programmed state, the circuit comprising:
   a node;
   means for applying a sensing current to the fuse;
   means for generating a voltage at the node in response to the means for applying that is indicative of the programming state of the fuse;
   means for storing the programmed or unprogrammed state of the fuse in response to the means for generating; and
   means for deactivating the means for applying while maintaining the voltage at the node that is indicative of the programming state of the fuse and maintaining the programmed or unprogrammed state of the fuse in the means for storing;
   wherein the means for applying is responsive to activation of a reset signal and wherein the means for deactivating is responsive to deactivation of the reset signal.

8. Apparatus for sensing a programmed or unprogrammed state of a fuse, wherein the fuse has a first impedance in the unprogrammed state and the fuse has a second impedance that is higher than the first impedance but is not open in the programmed state, the apparatus comprising:
   a node;
   a circuit that applies a sensing current to the fuse through the node such that a voltage is generated at the node that is indicative of the programmed or unprogrammed state of the fuse; and
   a latch that stores the programmed or unprogrammed state of the fuse in response to the circuit;
   wherein the circuit deactivates the sensing current after the latch stores the programmed or unprogrammed state of the fuse while maintaining the voltage that is generated at the node, and wherein the circuit applies the sensing current in response to activation of a reset signal and deactivates the sensing current in response to deactivation of the reset signal.

9. A method for sensing a programmed or unprogrammed state of a fuse, wherein the fuse has a first impedance in the unprogrammed state and the fuse has a second impedance that is higher than the first impedance but is not open in the programmed state, the method comprising the steps of:
   applying a sensing current to the fuse through a node;
   generating a voltage at the node to thereby indicate the programmed or unprogrammed state of the fuse;
   storing the programmed or unprogrammed state of the fuse; and
   terminating application of the sensing current while maintaining the voltage at the node that is indicative of the programmed or unprogrammed state of the fuse;

wherein the applying step is responsive to activation of a reset signal and wherein the terminating step is responsive to deactivation of the reset signal.

10. A fuse circuit comprising:

a fuse;

means for programming the fuse by applying a programming current to the fuse that is sufficient to increase the impedance of the fuse without opening the fuse;

current supplying means, first switching means and second switching means that are serially connected to the fuse, the first switching means and the second switching means defining a node therebetween;

means for generating a first control signal for the first switching means and a second control signal for the second switching means in response to a first transition of a reset signal;

means for producing an output signal that indicates whether the fuse is programmed, in response to a voltage at the node; and means for electrically disconnecting the current supplying means from the fuse via at least one of the first and second switching means in response to a second transition of the reset signal while maintaining the voltage at the node.

11. A fuse circuit according to claim 10 wherein the first and second switching means comprise respective first and second field effect transistors of opposite conductivity types.

12. A fuse circuit according to claim 11 wherein the means for producing an output signal comprises an inverter that produces the output signal from the voltage of the node, and wherein the means for generating is responsive to the output signal and the reset signal.

13. A fuse circuit according to claim 12 wherein the means for generating comprises:

a first logic circuit that is responsive to the reset signal and to the output signal to generate the first control signal; and a second logic circuit that is responsive to the reset signal and to the output signal to generate the second control signal.

14. A fuse circuit comprising:

a fuse;

a first circuit that programs the fuse by applying a programming current to the fuse that is sufficient to increase the impedance of the fuse without opening the fuse;

a current supply, a first switch and a second switch that are serially connected to the fuse, the first switch and the second switch defining a node therebetween;

a second circuit that generates a first control signal for the first switch and a second control signal for the second switch to electrically connect the current supply to the fuse in response to a transition of a reset signal from a first state to a second state such that a voltage is generated at the node, and to electrically disconnect the current supply from the fuse in response to a transition of the reset signal from the second state to the first state while maintaining the voltage at the node; and a third circuit that produces an output signal that indicates whether the fuse is programmed, in response to the voltage of the node.

15. A fuse circuit according to claim 14 wherein the first and second switches comprise respective first and second field effect transistors of opposite conductivity types.

16. A fuse circuit according to claim 15 wherein the third circuit comprises an inverter that produces the output signal from the voltage of the node, and wherein the second circuit is responsive to the output signal and the reset signal.

17. A fuse circuit according to claim 16 wherein the second circuit comprises:

a first logic circuit that is responsive to the reset signal and to the output signal to generate the first control signal; and a second logic circuit that is responsive to the reset signal and to the output signal to generate the second control signal.

18. A fuse circuit comprising:

a fuse;

a fusing controlling unit that supplies a first current to the fuse in response to a fusing control signal to thereby program the fuse;

a current supply unit that supplies a second current in response to a first control signal;

a switch that supplies the second current to the fuse in response to a second control signal, the current supply unit and the switch defining a node therebetween;

an inverter that inverts a level of the node to produce an output signal;

a first control signal generator that logically combines a reset signal and the output signal to produce the first control signal; and a second control signal generator that inverts the output signal and logically combines the inverted output signal and the reset signal to produce the second control signal.

19. A fuse circuit according to claim 18 wherein the first current is sufficient to increase the impedance of the fuse without opening the fuse.

20. A fuse circuit according to claim 18 wherein the current supply and the switch comprise respective first and second field effect transistors of opposite conductivity types.

* * * * *